(12) United States Patent
Shimazu et al.

(10) Patent No.: US 7,459,786 B2
(45) Date of Patent: Dec. 2, 2008

(54) SEMICONDUCTOR DEVICE

(75) Inventors: Hiromi Shimazu, Kashiwa (JP); Tomio Iwasaki, Tsukuba (JP); Hiroyuki Ohta, Tsuchiura (JP); Kensuke Ishikawa, Oume (JP); Osamu Inoue, Kodaira (JP); Takayuki Oshima, Oume (JP)

(73) Assignee: Renesas Technology Corp., Tokyo (JP)

( * ) Notice: Subject to any disclaimer, the term of this patent is extended or adjusted under 35 U.S.C. 154(b) by 78 days.

(21) Appl. No.: 11/155,272

(22) Filed: Jun. 17, 2005

(65) Prior Publication Data

US 2006/0006543 A1 Jan. 12, 2006

(30) Foreign Application Priority Data

Jun. 18, 2004 (JP) .............................. 2004-180455

(51) Int. Cl.
*H01L 23/48* (2006.01)
*H01L 23/52* (2006.01)
*H01L 29/40* (2006.01)

(52) U.S. Cl. ........................ 257/751; 257/750; 257/758; 257/774; 257/E23.011; 438/622; 438/653

(58) Field of Classification Search ................. 257/751, 257/752, 758, 762, E23.011, 750, 774; 438/622, 438/653
See application file for complete search history.

(56) References Cited

U.S. PATENT DOCUMENTS

| | | | | |
|---|---|---|---|---|
| 5,721,157 A | * | 2/1998 | Sunada | 438/624 |
| 5,966,606 A | * | 10/1999 | Ono | 438/303 |
| 6,219,125 B1 | * | 4/2001 | Ishikura et al. | 349/147 |
| 6,455,891 B2 | * | 9/2002 | Shimomura et al. | 257/324 |
| 2004/0227242 A1 | * | 11/2004 | Noguchi et al. | 257/751 |
| 2005/0009320 A1 | * | 1/2005 | Goundar | 438/624 |

FOREIGN PATENT DOCUMENTS

JP 2003-257979 9/2003
JP 2003-303880 10/2003

* cited by examiner

*Primary Examiner*—Kenneth Parker
*Assistant Examiner*—John Lin
(74) *Attorney, Agent, or Firm*—Townsend and Townsend and Crew LLP

(57) ABSTRACT

A reliable semiconductor device having a multilayer wiring structure formed of copper as a main component material, which constrains occurrence of voids caused by stress migration. In the multilayer wiring structure, a first insulation layer having a high barrier property and a compression stress, and making contact with the upper surface of a first wiring made of copper as a main component material, a second insulation film having a tensile stress, and a third insulation film having a dielectric constant which is lower than those of the first and second insulation film, are laminated one upon another in the mentioned order as viewed the bottom thereof, and a via hole is formed piercing through the first insulation film, the second insulation film and the third insulation film, making contact with the first wiring.

10 Claims, 7 Drawing Sheets

SEMICONDUCTOR DEVICE

BACKGROUND OF THE INVENTION

The present invention relates to a semiconductor device, and in particular to a semiconductor device using a conductor film made of copper as a main component, that is, a main wiring material of a buried wiring.

These years, due to high dense integration of LSIs, and microminiaturization of transistors for the purpose of high speed operation, a signal delay in wiring has become not negligible, and accordingly, a decrease in wiring resistance and a decrease in interwiring capacitance have been eagerly desired. Thus, there has been being developed a copper wiring technology utilizing copper (Cu), as a wiring material, which has a resistance lower than that of conventionally used aluminum alloys and which is excellent in migration resistance. Further, in order to decrease the interwiring capacitance, it has been considered to use a low dielectric constant insulation film as an interlayer insulation film material.

These copper wiring structures are formed in a buried wiring technology which is, for example, as follows: wiring apertures such as wiring channels or holes are formed in an insulation film, and thereafter, a conductive barrier and a conductive film made of copper as a main component are deposited and laminated on the insulation film including the insides of the wiring apertures in the mentioned order as viewed from the bottom side. Then, with the use of a chemo-mechanical polishing process or the like, extra conductive film and conductive barrier film are polished off so as to obtain buried wirings within the wiring apertures. Thereafter, after cleaning, a diffusion preventing insulation film such as a silicon nitride film is formed on the upper surfaces of the insulation film and the buried wirings, and then, a low dielectric constant film is deposited on the upper surface of the diffusion preventing insulation film.

However, in the progress of the development of the copper wiring structures, it has been found that this structure is unexpectedly poor in migration resistance, that is, there would be a risk of formation of voids in a copper wiring or a via due to stress migration. Accordingly, the following technology has been disclosed:

JP-A-2003-303880 discloses a technology in which an interlayer insulation film has a laminated structure in order to reduce a stress in a connection zone between an upper wiring layer and a via (a technology of preventing occurrence of stress migration in a via), and further, JP-A-2003-257979 discloses a technology in which impurity atoms are added in copper for wiring (a technology for preventing stress migration in a copper wiring).

However, in a semiconductor device having the above-mentioned copper wiring structure, a wiring in the lower part of a via hole, which connects among the wirings, causes a problem of occurrence of an inferior stress migration therein. This problem is noticeable if the via hole has a small diameter, that is, voids occurs in a wiring part around the lower part of the via hole, and accordingly, the wiring resistance becomes larger, resulting in occurrence of a risk of wire-breakage.

SUMMARY OF THE INVENTION

Accordingly, an object of the present invention is to provide a reliable semiconductor device having a wiring structure made of copper as a main component, which can restrain occurrence of voids caused by stress migration.

To the end according to the principal concept of the present invention, there is provided a semiconductor device having a multi-layer wiring structure formed on a semiconductor substrate through the intermediary of the intermediary of the insulation film, comprising, a first wiring made of copper as a main component, provided on the semiconductor substrate through the intermediary of an insulation film, a first insulation film formed on the first wiring, having a barrier property for the copper of the first wiring and having a compression stress, a second insulation film formed on the first insulation film and having a stress with a sign which is reverse to that of the compression stress of the first insulation film, a third insulation film formed on the second insulation film and having a dielectric constant which is lower than those of the first and second insulation film, a via formed on the first insulation film and piercing through the second and third insulation films, and a second wiring connected to the first wiring through the intermediary of the via.

In the above-mentioned configuration, the first insulation film preferably has a film thickness which is less than that of the second insulation film.

In the above-mentioned configuration, it is preferable that the insulation film has a Yong's modulus which is greater than that of the second insulation film, and further, and the first insulation film has a film thickness which is less than that of the second insulation film.

In the above-mentioned configuration, the second insulation film preferably has a high barrier property.

In the above-mentioned configuration, the first insulation film is preferably formed of an insulation film containing nitrogen atoms.

In the above-mentioned configuration, the third insulation film is a low dielectric constant insulation film having a tensile stress.

The present inventions exhibits various advantages typical ones of which will be hereinbelow described:

According to the present invention, the wirings formed of a metal film made of copper as a main component has a residual stress gradient in the vicinity of the bottom part of the via, and accordingly, occurrence of voids caused by stress migration can be restrained, thereby it is possible to provide a reliable semiconductor device.

Explanation will be hereinbelow made of the present invention with reference to the accompanying drawings, in which:

Other objects, features and advantages of the invention will become apparent from the following description of the embodiments of the invention taken in conjunction with the accompanying drawings.

BRIEF DESCRIPTION OF THE ACCOMPANYING DRAWINGS

DESCRIPTION OF PREFERRED EMBODIMENTS OF THE INVENTION

First Embodiment

Explanation will be made of a first embodiment of the present invention with reference to FIG. 1.

Figure 1:
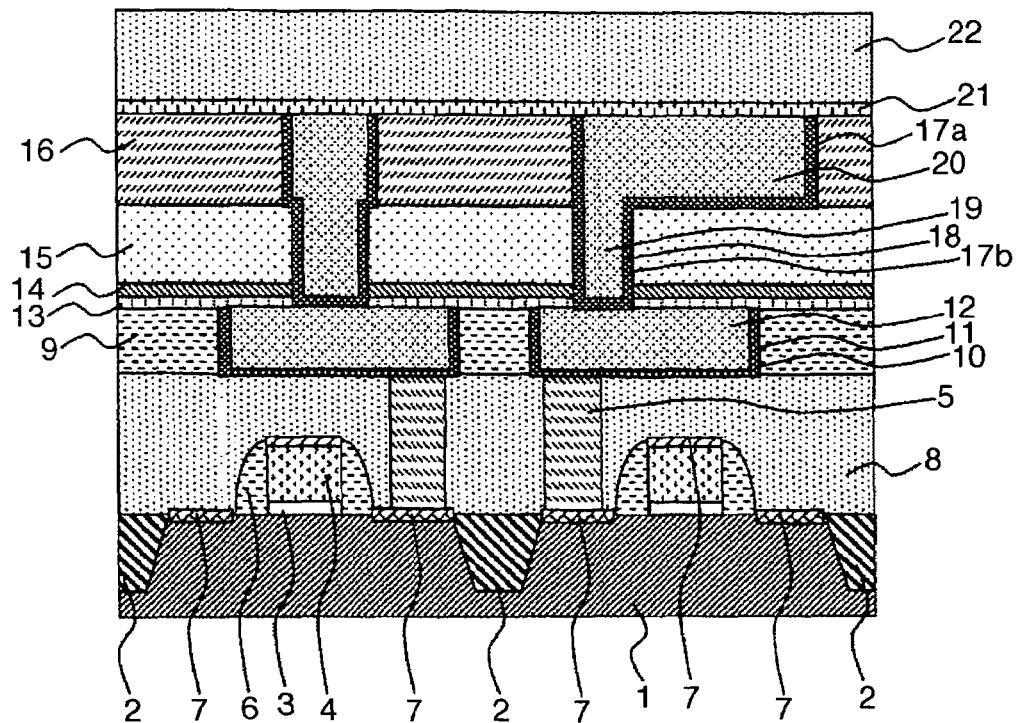
FIG. 1 is a sectional view illustrating a structure of a principal part of a semiconductor device in a first embodiment of the present invention.

A semiconductor device shown in FIG. 1 is composed of a silicon substrate made of, for example, single crystal silicon, as a semiconductor substrate, and transistors formed on a principal plane (an element forming plane or a circuit forming plane) of the substrate. Each transistor is composed of, for example, a gate insulation film 3, a gate electrode 4 and a diffusion layer (which is not shown) and the like. The respective transistors are isolated from one another by element separating films made of silicon oxide, silicon nitride or the like. Further, silicides 7 are formed on the top surfaces of the gate electrodes 4 and the diffusion layers.

The gate insulation films 3 are made of a dielectric film made of a material selected from a group consisting of silicon oxide, silicon nitride, titanium oxide, zirconium oxide, hafnium oxide, tantalum pentoxide and the like, or a laminated structure thereof, and are produced by chemical vapor deposition, sputtering or the like. Further, the gate electrodes 4 are formed of a film selected from a group consisting of a polycrystal silicon film, a metal film, a silicon germanium film and a metal silicide film or a laminated structure thereof, and is produced by a chemical vapor deposition, sputtering or the like.

Side walls 6 made of silicon oxide, silicon nitride or the like are formed at side walls of the gate insulation films 3, the gate electrodes 4 and the silicides 7.

The silicon substrate 1 including the transistors are covered over its entire upper surface in the principal plane with an insulation film 8. It is noted here that the insulation film 8 is formed of, for example, a low dielectric insulation film (a porous material such as SiOC, SiOF, $SiO_2$, or the like) a BPSG (boron-doped phosphosilicate glass) film, an SOG (spin on glass) film, or a silicon oxide film made of tetraethoxysilane (which will be hereinbelow referred to as "tetraethoxy-silicate" film) and produced by chemical vapor deposition or sputterin, a silicon oxide film or a nitride film which are produced by chemical vapor deposition or sputtering. Alternatively, it may be formed of a laminated structure thereof. It is noted that it may be formed of any or insulation films without being limited by the above-mentioned films.

Further, a first interwiring insulation film 9 is formed on the upper surface of the insulation film 8. The first interwiring insulation film 9 is formed of, similar to the insulation film 8, a low dielectric insulation film (a porous material such as SiOC, SiOF, $SiO_2$, or the like), a BPSG film, an SOG film, a TEOS film, or a silicon oxide film or a nitride film which are made of chemical vapor deposition or sputtering. Alternatively, it may be formed of a laminated structure thereof. It is noted that the film 9 may be formed of any or insulation films without being limited by the above-mentioned films.

For example, the first interwiring insulation film 9 has a laminated structure consisting of a TEOS film, a dielectric insulation film and a TEOS film which are laminated one upon another in the mentioned order as viewed from the bottom of the structure in order to ensure a mechanical strength of the low dielectric insulation film. However, there may be used a low dielectric insulation film which is formed by the above-mentioned chemical vapor deposition (CVD), instead of the TEOS film.

The first interwiring insulation film 9 is formed therein with wiring grooves 10 in which wirings are formed. Each of the wiring grooves 10 is formed therein with a barrier film 11 including a tantalum nitride film (TaN) and a tantalum film (Ta) which are produced by sputtering in the mentioned order as viewed from the bottom thereof. The barrier film 11 may also be produced by CVD or ionization sputtering which is one kind of sputtering processes. This ionization sputtering ionizes metal from which the barrier film is formed, and applies a bias to the substrate so as to allow metal ions to be directional. With this process, a film can be deposited even within a fine grooves with satisfactory covering ability.

The barrier film 11 should not be limited to the above-mentioned laminated film composed of TaN and Ta, but may be formed of a monolayer film made of, for example, Ta, TaN, TaSiN, W, tungsten nitride (WN), WSiN, Ti, TiN or TiSiN or a laminated film thereof. Further, as the barrier film 11, there may be used a monolayer made of Ru, or Ru added therein with Ti, a laminated film formed of Ru and TiN or a laminated film of Ru and TaN. The barrier film using Ru can offer such advantages that the adherence between RU and Cu can be enhanced and migration can be prevented.

Then, a first copper wiring 12 is formed on the barrier film 11 in the wiring channel 10. The first copper wiring 12 is formed of a lamination composed of a seed film for electroplating, and a plating film. The seed film is formed by sputtering such as ionization sputtering.

The diffusion layer formed on the principal plane of the silicon substrate 1 and the first copper wiring 1 formed above the principle plane of the silicon substrate are electrically connected with each other by means of a contact plug 5 formed on the above-mentioned insulation film 8.

Next, a diffusion preventing film 13 is formed on the upper surfaces of the first interwiring insulation film 9 and the first copper wiring 12. The diffusion preventing film 13 is used as a barrier for preventing copper atoms from being diffused in the interlayer insulation film. It is noted here that the diffusion preventing film 13 has a barrier property against copper diffusion, which is higher than that of the silicon oxide, and also has high compression stress.

It is noted there that there may be used, as the above-mentioned wiring diffusion preventing film, an SiN film (silicon nitride film), an SiON film (silicon oxynitride film), an SiC film (silicon carbide film) or an SiSN film (silicon carbonitride film) or the like.

Further, a first interlayer insulation film 14 is formed on the upper surface of the diffusion preventing film 13. the first interlayer insulation film 14 has high tensile stress. Then, a second interlayer insulation film 15 is formed on the upper surface of the first interlay insulation film 14.

It is noted that the second interlayer insulation film 15 is formed of, for example, a low dielectric insulation film, that is, a film made of, as a main component, SiC, SiOF or SiC, an organic polymer film having aromatic hydrocarbon structure (a film containing C and H). Further, the dielectric constant can be lowered by forming pores (so as to have porosity) in any of these films, an $SiO_2$ film (silicon oxide film) or the like. Further, the low dielectric insulation film may be formed by coating an aromatic polymer material over the above-mentioned material before heat-treatment. Alternatively, there may be used an organic silica glass on the low dielectric insulation film. In this case, the film is also heat-treated after it is coated thereover with the material. This organic silica glass is mainly composed of SiOCH. Further, there may be used another organic material or any of the above-mentioned material in which pores are formed.

The dielectric constant of the low dielectric insulation film is not greater than 3.7 which is lower than that of a silicon oxide film (for example, a TEOS film), and as a result, the parasitic capacitance between wirings can be reduced, thereby it is possible to aim at speeding u the operation of the semiconductor device.

A second interwiring insulation film 16 is formed on the second interlayer insulation film 15.

It is noted that the second interwiring insulation film 16 is formed, similar to the first interwiring insulation film 9, of, for example, a low dielectric insulation film (SiOC, SiOF or a porous material made of SiOC, $SiO_2$ or the like), a BPSG film, an SOG film, a TEOS film, either one of a silicon oxide and a nitride film which are formed by CVD or sputtering, or the like. Alternatively, it may be formed of a laminated structure thereof. It should not be limited to the above-mentioned film, but any of various insulation films may be used therefor.

A via hole (connection hole) 17b and a wiring channel 17a are formed piercing through the second interlayer insulation film 16, the second interlayer insulation film 15, the first interlay insulation film 14 and the diffusion preventing film 14. The via hole 17b is formed between the first copper wiring 12 and the wiring channel 17a, piercing through the second interlay insulation film 15, the first interlayer insulation film 14 and the diffusion preventing film 13 in order to connect the wiring channel 17a with the first copper wiring 12.

In each of the via hole 17b and the wiring channel 17a, there is formed the barrier film 18 containing a tantalum nitride film (TaN) and a tantalum film (Ta) formed in the mentioned order as viewed from the bottom, by sputtering. The barrier film 18 may be made of CVD or ionization sputtering which is one kind of sputtering processes. This ionization sputtering can allow metal constituting the barrier film to be ionized, and further, and applies a bias to the substrate so as to allow metal ions to be directional. Thereby it is possible to form a film even within a fine channel with satisfactory covering property.

The barrier film 18 should not be limited to the above-mentioned laminated film of TaN and Ta, but a monolayer film made of, for example, Ta, TaN, TaSiN, tungsten nitride (WN), WSiN, Ti, TiN or TiSiN, or a laminated film thereof may be used therefor. Further, as the barrier film 18, there may be used a monolayer film made of Ru, Ru added with Ti, or a laminated layer of Ru and TaN. In the case of using Ru in the barrier film 18, it is possible to offer such advantages that the adhesion between Ru and Cu can be enhanced, and stress migration can be prevented.

Then, a via 19 formed of a copper film as a main component and a second copper wiring 20 are formed on the barrier film 18 in the via hole 17b and the wiring channel 17b. Each of the via 19 and the second copper wiring 20 is composed of a seed film for electroplating and a plating film which are laminated one upon another. The seed film is formed by sputtering such as ionization sputtering.

It is noted here that the via 19 is formed of a part of the copper wiring 20, for electrical connection between the copper wiring 20 and the copper wiring 12 underneath thereof.

Next, an insulation film 21, an insulation film 22 and the like are formed on the upper surfaces of the second interwiring insulation film 16 and the second copper wiring 20.

Thereafter, a semiconductor device is completed by desired process steps.

In this embodiment, explanation has been hereinabove made of the semiconductor device having the two layer wiring structure, but with repetitions of steps from forming the diffusion preventing insulation film 13 to forming the second interwiring insulation film 16 by a number with which a required number of wiring layers are obtained, a semiconductor device having a multilayer structure can be obtained.

The wiring structure according to the present invention may be formed for at least one layer in a multilayer structure. That is, it is not always necessary to form the wiring structure for every layer in the multilayer structure.

The smaller the diameter of the via, the higher the speed-u of stress migration in the wiring in the lower part of the via, thus, by applying the wiring structure according to the present invention to the interlayer insulation film alone which is formed therein with the underneath part of the via having a minimum via diameter that is relatively small, it is possible to prevent a number of process steps from being increased, and to also prevent stress migration from increasing a resistance.

Next, explanation will be made of technical effects and advantages exhibited by the semiconductor device in this embodiment having the configuration stated above. As to conventional wiring formed of a copper film as a main material, there has been a risk of occurrence of voids in the lower part of the via caused by stress migration, resulting in an increase in resistance. Through experiments and analysis made by the inventors, it has been found that an increase in resistance caused by voids in the wiring in underneath the via was accelerated as the stress gradient of the copper film in the lower part of the via.

Further, the inventor has been found that the stress gradient of the copper film underneath the via can be reduced by constraining the stress of an insulation film structure in a part where a via hole for connection of the second wiring is formed in the upper surface of the first wiring made of copper as a main component material, thereby it is possible to prevent the resistance from being increased by voids in the wiring underneath the via.

That is, in the case of the diffusion preventing insulation film having compression stress, the first copper wiring 12 is exerted thereto with a compression force from the side wall of the via hole 14b, resulting in inducing of stress gradient in the vicinity of the lower part of the via. Thus, with the provision of the first interlayer insulation film having a tensile stress having a sign reverse to that of the diffusion preventing insulation film 13, the compression stress exerted to the copper wiring can be reduced, thereby it is possible to reduce the stress gradient induced in the lower part of the via. Thus, the growth of voids caused by stress migration in the lower part of the via can be constrained, thereby it is possible to prevent the resistance from being increased. Thus, there can be provided a reliable semiconductor device.

In this case, it is preferable that the film thickness of the diffusion preventing film 13 is less than that of the first interlayer insulation film 14 because the longer the distance away from the upper surface of the copper wiring, the smaller the affection upon the copper wire. Thus, by setting the film thickness of the first interlayer insulation film 14 which is formed on the upper surface of the diffusion preventing film 13 directly formed on the copper wiring so as to be lager than that of the diffusion preventing insulation film 13, the higher effect can be obtained.

Further, it is preferable that the Yong's modulus of the diffusion preventing film 13 is greater than that of the first interlayer insulation film 14. This is because a material having a high Yong's modulus exhibits high interatomic bonding and is high dense, and accordingly, the effect of preventing copper atoms from being diffused into the insulation film from the copper wiring can be enhanced. In this case, it is preferable that the film thickness of the diffusion preventing insulation film 13 is smaller than that of the first interlayer insulation film 14. This is because the smaller the Yong's modules, the smaller the force exerted to the lower material, and accordingly, by setting the film thickness of the first interlayer insulation film so as to be larger than that of the diffusion preventing insulation film, the constraint of action of the compression stress of the diffusion preventing film can be more effective.

Further, if the first interlay insulation film 14 has a higher barrier property against diffusion of copper atoms, this thickness of the diffusion preventing insulation film 13 can be deceased. Thus, a dense insulation film having a compression stress has a relatively high dielectric constant. Thus, by using an insulation film having a dielectric constant lower than that of the diffusion preventing insulation film, a tensile stress and a high barrier property, as the first interlayer insulation film 14 formed on the upper surface of the diffusion preventing insulation film having a compression stress, there can be also exhibited such an advantage that the interwiring capacitance is reduced. Further, by setting the film thickness of the first interlayer insulation film 14 to be thicker than that of the diffusion preventing film 13, the interwiring capacitance can be also reduced.

Further, by forming the diffusion preventing insulation film 13 from an insulation film made of SiCN, Sin or the like containing at least nitrogen atoms, the adherence to the copper wiring can be enhanced, thereby there can be offered such an adventage that the copper wiring and the diffusion preventing insulation film 13 can be prevented from peeling off from each other at their interface.

Further, by forming the second interlayer insulation film 15 from a low dielectric insulation film having a tensile strength which is in the same direction as that of the first interlayer insulation film 14, the interface stress between the first interlayer insulation film 14 and the second interlayer insulation film is reduced, thereby it is possible to offer such an advantage as to prevent them from peeling off from each other at their interface.

Further, by reducing the compression stress of the diffusion preventing insulation film 13 itself, the compression stress exerted to the first copper wiring 12 can be reduced,thereby it is possible to reduce the stress gradient induced in the lower part of the via. However, since there would be presented such a risk that the dense property of the film is reduced so as to lower the barrier property against the copper diffusion by changing the stress of the diffusion preventing insulation film 13 in accordance with a film forming condition, it is required that the diffusion preventing insulation film has a quality which is in consideration with the barrier property. Thus, the film stress of the first interlayer insulation film 14 formed on the upper surface of the diffusion preventing insulation film 13 which is provided for constraining the action of the stress, has a sign reverse to that of the diffusion preventing insulation film 13, the formation of voids in the copper wiring can be constrained, thereby it is possible to provided a semiconductor device having a reliable copper wiring structure.

Second Embodiment

Next, explanation will be hereinbelow made of a second embodiment of the present invention with reference to FIG. 2 which is a sectional view illustrating a principal part of a semiconductor device in this embodiment, and like reference numerals are used to denote like parts to those in the first embodiment.

The semiconductor device in the second embodiment of the present invention has the same configuration as that of the first embodiment, except that an insulation film 23 and an insulation film 24 are provided in the interface between the second interlayer insulation film 15 and the second interwiring insulation film 16 in the structure of the first embodiment shown in FIG. 1, in the mentioned order as viewed from the bottom. Technical effects and advantages similar to those in the first embodiment can be obtained.

It is noted that the insulation film 23 is for capping the second interlayer insulation film 15 formed of a low dielectric film. For example, the insulation film 23 is formed of a silicon oxide (SiOx) film a typical of which is a silicon dioxide (SiO$_2$) film. Thereby it is possible to ensure a mechanical strength for the second interlayer insulation film 15 during, for example, chemomechanical polishing (CMP), and further to ensure the surface protection and the moisture resistance.

The thickness of the insulation film 23 is set so as to be relatively less than the second interlayer insulation film 15, that is, for example, it is in a range from about 25 to 100 nm, and is preferably about 50 nm.

The insulation film 23 should not be limited to the silicon oxide film, but any of various films including a silicon nitride (SixNy) film, a silicon carbide film (SiC) film or a silicon carbonitride (SiCN) film can be used therefor.

The insulation film 24 is used as an etching stopper. By setting the etching selection ratio between the second interwiring insulation film 16 and the insulation film 24 to a large value, the insulation film 24 is selectively removed by etching after the etching on the outer surface of the insulation film 24 is once stopped. Thus, the accuracy of the depth of the wiring cannel 17a to be formed can be enhanced, thereby it is possible to prevent the wiring channel 17a being formed by an excessive depth.

The thickness of the insulation film 24 is set so as to be relatively less than the second interlayer insulation film 15, that is, for example, it is in a range from about 25 to 100 nm, and is preferably about 50 nm.

Third Embodiment

Next, explanation will be made of a third embodiment of the present invention with reference to FIG. 3 which is a sectional view illustrating a principal part of a semiconductor device in the third embodiment, and like reference numerals are used to denote like parts to those explained in the first embodiment.

Figure 3:
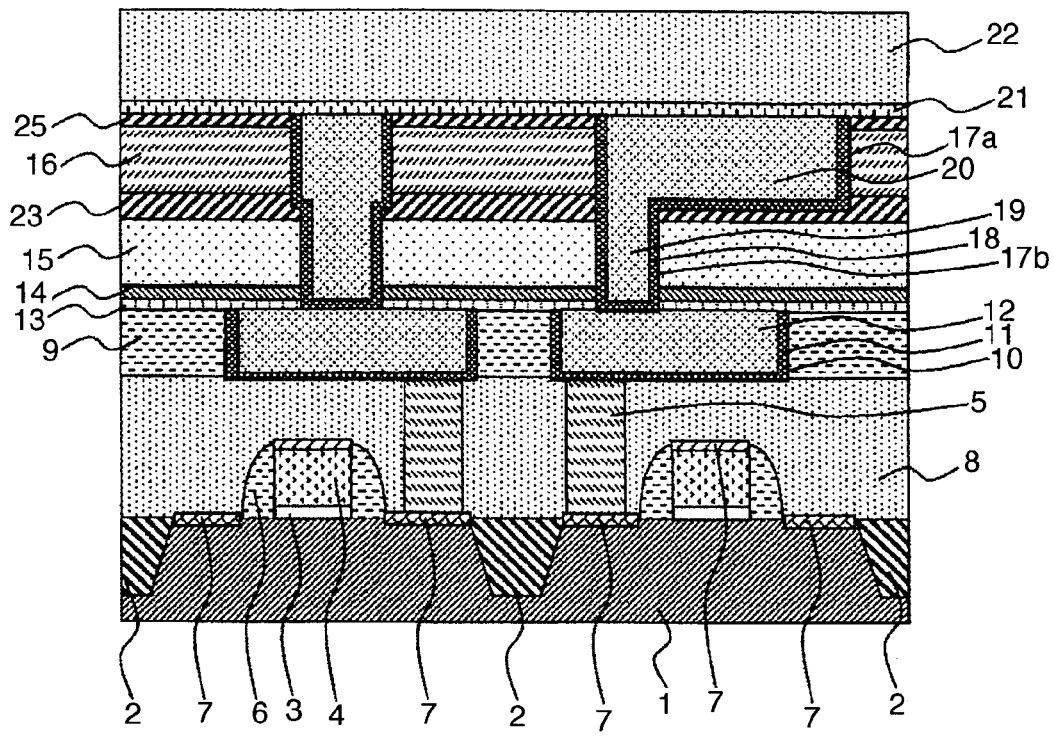
FIG. 3 is a sectional view illustrating a principal part of a semiconductor device in a third embodiment of the present invention.

The semiconductor device in the third embodiment as shown in FIG. 3 has the same configuration as that of the first embodiment, except that only an insulation film 23 is formed in the interface between the second interlayer insulation film 15 and the second interwiring insulation film 16 in the structure of the first embodiment shown in FIG. 1. This embodiment can exhibit technical effects and advantages similar to those exhibited in the first embodiment.

It is noted that the insulation film 23 is an insulation film for capping the second interlayer insulation film 15 formed of a low dielectric insulation film. For example, the insulation film 23 is formed of a silicon oxide (SiOx) film a typical of which is a silicon dioxide ($SiO_2$) film. Thereby it is possible to ensure a mechanical strength for the second interlayer insulation film 15 during, for example, chemomechanical polishing (CMP), and further to ensure the surface protection and the moisture resistance.

The thickness of the insulation film 23 is set so as to be relatively less than the second interlayer insulation film 15, that is, for example, it is in a range from about 25 to 150 nm.

The insulation film 23 should not be limited to the silicon oxide film, but any of various films including a silicon nitride (SixNy) film, a silicon carbide film (SiC) film or a silicon carbonitride (SiCN) film can be used therefor.

The insulation film 23 also serves as the etching stopper in the second embodiment. Since the necessity of the insulation film 24 in the second embodiment can be eliminated, the man-hours required for manufacturing the semiconductor device in the third embodiment can be reduced.

Fourth Embodiment

Figure 4:
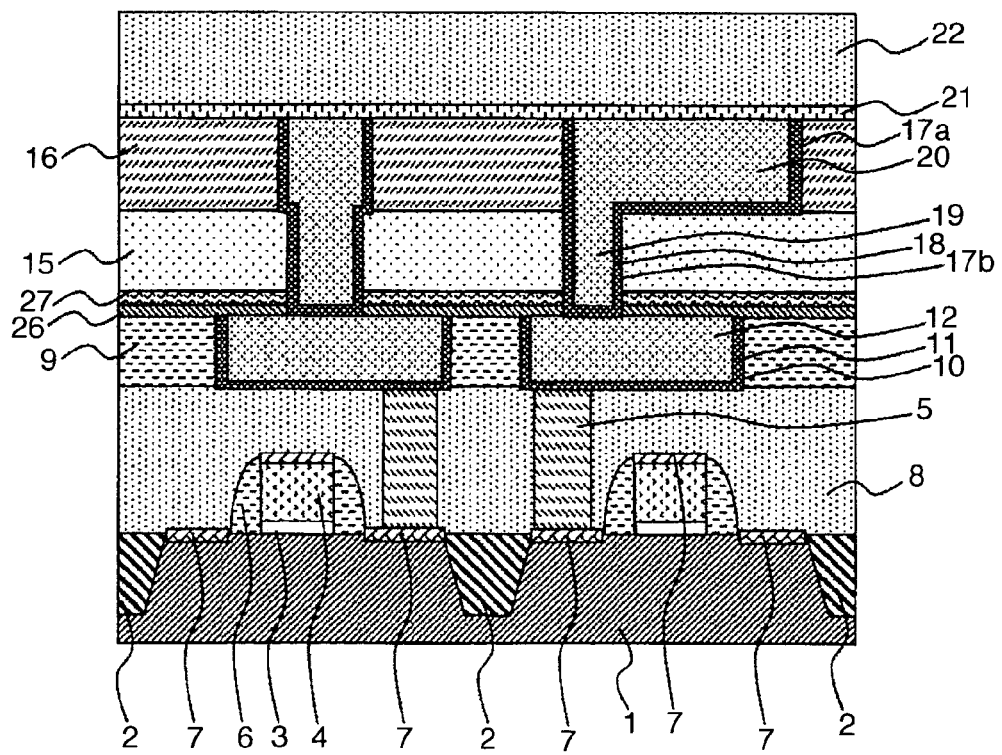
FIG. 4 is a sectional view illustrating a principal part of a semiconductor device in a fourth embodiment of the present invention.

Next, explanation will be made of a fourth embodiment of the present invention with reference to FIG. 4 which is a sectional view illustrating a principal part of a semiconductor device in the fourth embodiment, and like reference numerals are used to denote like parts to those explained in the first embodiment.

The semiconductor device in the fourth embodiment has the same configuration as that of the first embodiment, except that a diffusion preventing insulation film 26 having a tensile stress is provided, instead of the diffusion preventing insulation film 13 having a compression stress in the structure of the first embodiment shown in FIG. 1, and further, a first interlayer insulation film 27 having a compression stress is provided, instead of the first interlayer insulation film 14. This embodiment can exhibit technical effects and advantages similar to those exhibited by the first embodiment.

In such a case that the diffusion preventing insulation film 26 formed on the upper surface of the first copper wiring 12 has a compression stress, the first copper wiring 12 is exerted thereto with a tensile strength from the side wall of the via hole 17b, and accordingly, a stress gradient is induced in the vicinity of the lower part of the via.

Accordingly, with the provision of the first interlayer insulation film 27 having a compression stress with a sign reverse to that of the diffusion preventing insulation film 26, the tensile stress exerted to the copper wiring can be reduced, and accordingly, the stress gradient induced in the lower part or the via can be reduced. Thereby it is possible to constrain the growth of voids caused by stress migration in the lower part of the via, and accordingly, it is possible to prevent the resistance from being increased. Thus, there can be provided a reliable semiconductor device.

Further, since the first copper wiring 12 usually has a tensile stress, with the provision of the diffusion preventing insulation film 26 having a tensile stress on the upper surface of the first wiring layer 12, an interface stress between the first copper wiring 12 and the diffusion preventing insulation film 26 can be reduced, thereby it is possible to exhibit such an advantage as to constrain stress migration.

Further, by setting the film thickness of the diffusion preventing insulation film 26 having a tensile stress to be less than that of the first interlayer insulation film 27 having a compression stress, the stress gradient induced in the copper wiring can be effectively constrained. This is because the longer the distance away from the upper surface of the copper wiring, the smaller the affection upon the copper wiring, it is required to set the film thickness of the first interlayer insulation film 27 formed on the upper surface of the diffusion preventing insulation film 26 directly formed on the upper surface of the copper wiring, to be larger than that of the diffusion preventing insulation film 26.

By forming the first interlayer insulation film 27 having a high barrier property against diffusion of copper atoms, the diffusion preventing insulation film 26 can have a less thickness. Thus, with such a configuration that the depth of the via is not changed, the second interlayer insulation film 15 formed of a low dielectric insulation film can have a larger film thickness, thereby it is possible to reduce the interwiring capacitance.

In the case of the first interlayer insulation film 27 having a higher barrier property against copper atoms, by setting the Yong's modulus of the diffusion preventing insulation film 26 to be smaller than that of the first interlayer insulation film 27 and by setting the film thickness of the diffusion preventing insulation film 26 having a tensile stress to be larger than that of the first interlayer insulation film 27 having a compression stress, the interwiring capacitance can be reduced.

Figure 2:
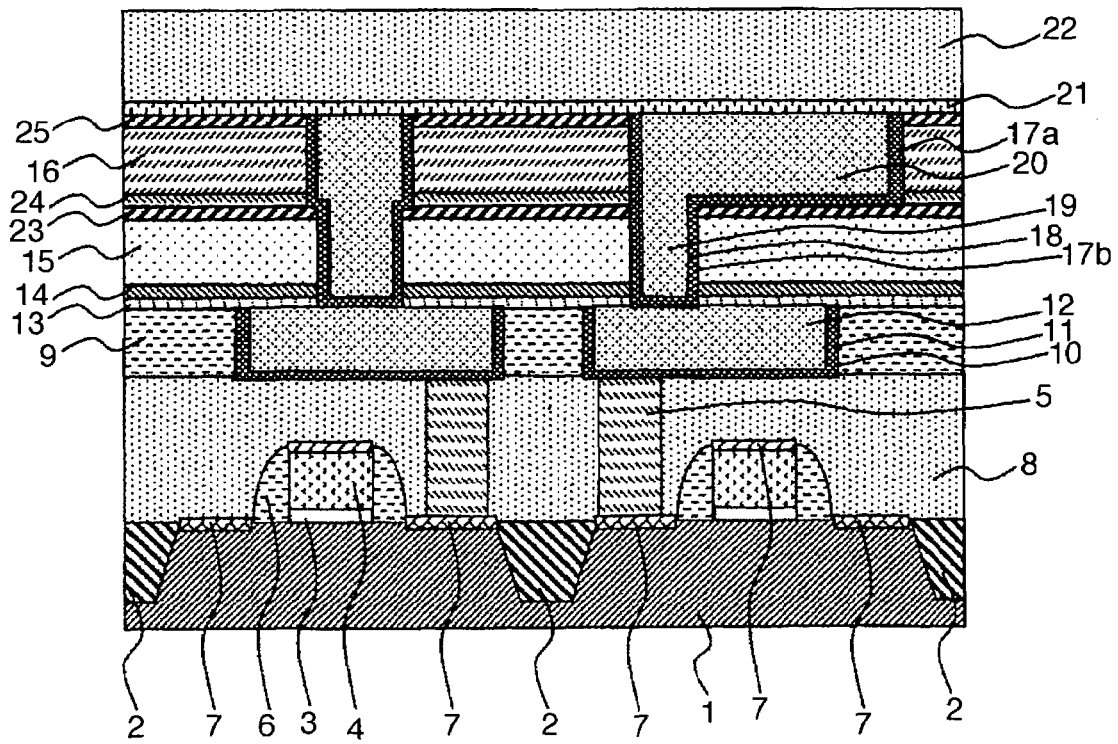
FIG. 2 is a sectional view illustrating a principal part of a semiconductor device in a second embodiment of the present invention.

Further, similar to the second and third embodiments shown in FIGS. 2 and 3, in the case of the provision of the laminated structure of the insulation film 23 and the insulation film 24 or the single layer of the insulation film 23 in the interface between the second interlayer insulation film 15 and the second interwiring insulation film 16, a mechanical strength can be ensured for the second interlayer insulation film 15, and further, the surface protection and the moisture resistance can be also ensured. Further, there can be exhibited such an advantage that the function of the etching stopper can also be obtained.

Fifth Embodiment

Next, explanation will be made of a fifth embodiment of the present invention with reference to FIG. 5 which is a sectional view illustrating a principal part of a semiconductor device in the fifth embodiment. Like reference numerals are used to denote like parts to those explained in the first embodiment.

Figure 5:
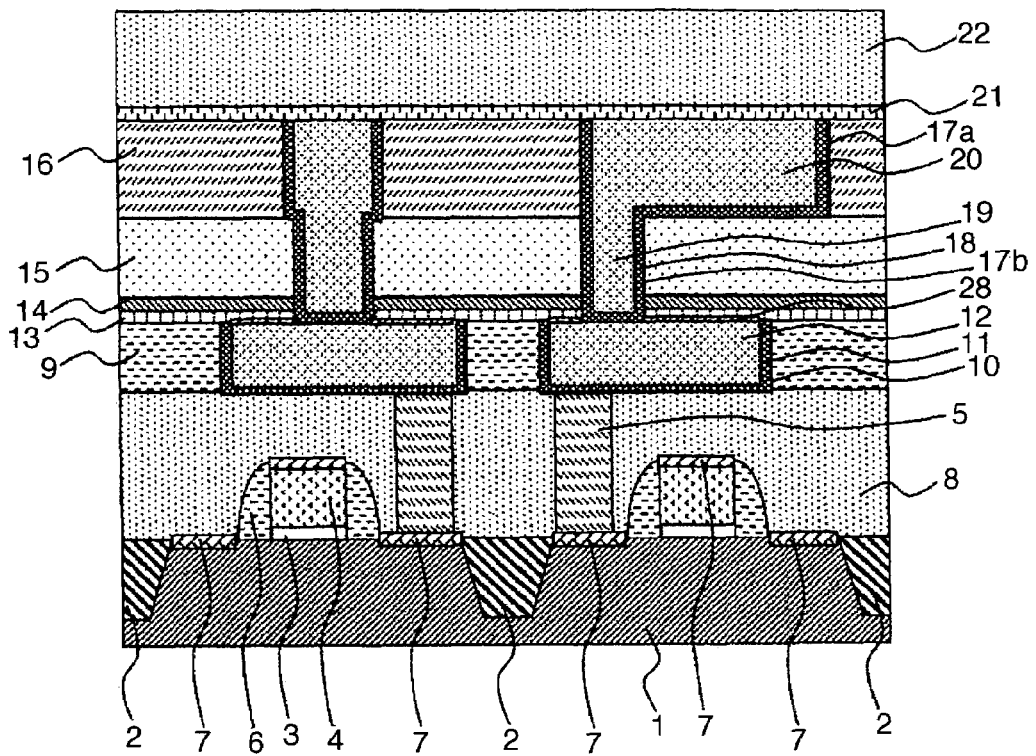
FIG. 5 is a sectional view illustrating a principal part of a semiconductor device in a fifth embodiment of the present invention.

The semiconductor device in this embodiment as shown in FIG. 5 has the same configuration as that of the first embodiment, except that a copper nitride layer 28 is formed in the interface between the first copper wiring 12 and the diffusion preventing insulation film 13 in the structure of the first embodiment shown in FIG. 1. This embodiment exhibits technical effects and advantages similar to those exhibited by the first embodiment.

With the provision of the copper nitride layer 28 in the interface between the first copper wiring 12 and the diffusion preventing insulation film 13, the barrier property against diffusion of copper atoms into the insulation film can be enhanced, and further, a reliable semiconductor device can be provided.

Further, since the barrier property against diffusion of copper atoms can be ensured by the copper nitride film 28, the diffusion preventing insulation film 13 can have a less film thickness while the film thickness of the second interlayer insulation film having a dielectric constant which is lower than that of the diffusion preventing insulation film 13 can have a larger film thickness, thereby it is possible to reduce the interwiring capacitance.

Figure 6:
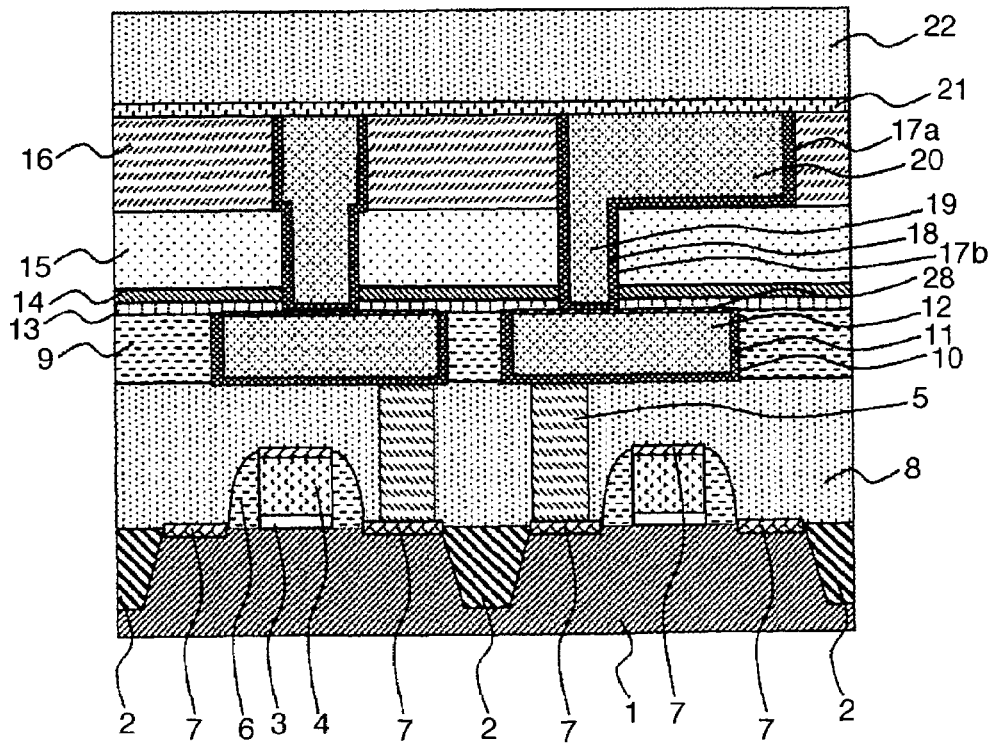
FIG. 6 is a sectional view illustrating a principal part of a semiconductor device in a sixth embodiment of the present invention.

Although explanation has been made of the fifth embodiment shown in FIG. 5 such that the copper nitride layer 28 is formed only in the interface between the first copper wiring 12 and the diffusion preventing insulation film 13, as in a six embodiment shown in FIG. 6, the copper nitride layer 28 may be formed also in the interface between the first copper wiring 12 and the via 19. However, it is preferable to provide the copper nitride layer 28 only in the interface between the first copper wiring 12 and the diffusion preventing insulation film 13 in view of reduction of the contact resistance between the via and the wiring.

Seventh Embodiment

Figure 7:
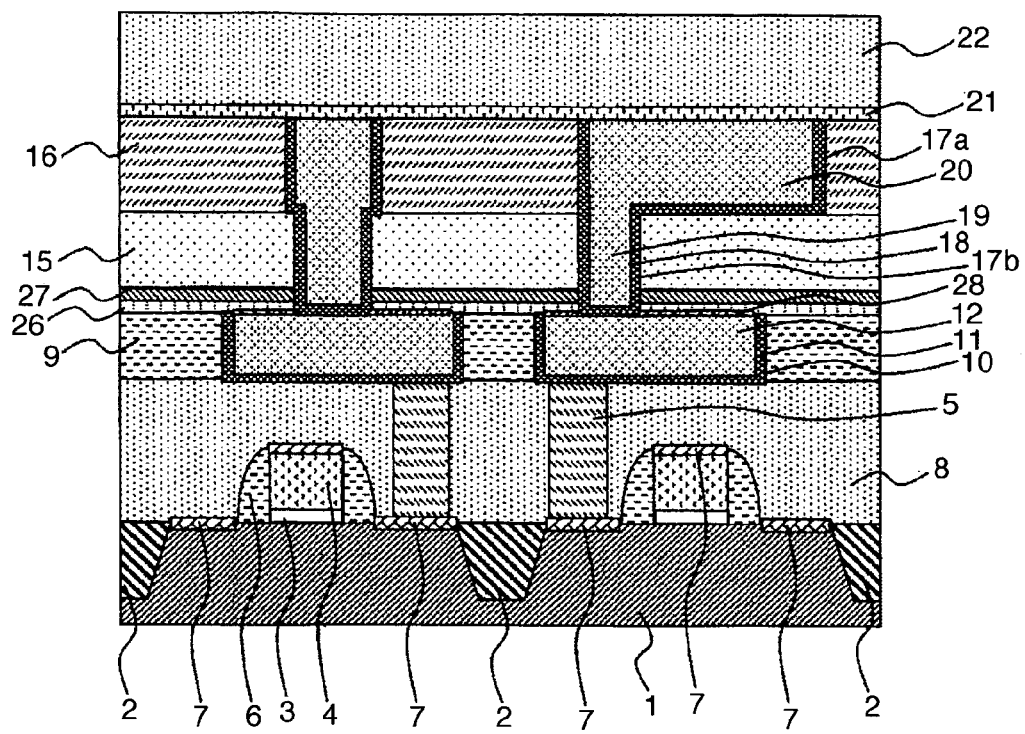
FIG. 7 is a sectional view illustrating a principal part of a semiconductor device in a seventh embodiment of the present invention.

Next, explanation will be made of a seventh embodiment of the present invention with reference to FIG. 7 which is a sectional view illustrating a principal part of a semiconductor device in the seventh embodiment. Like reference numerals are used to denote like parts those explained in the second embodiment.

The semiconductor device in the seventh embodiment has the same configuration as that of the second embodiment shown in FIG. 2, except that a copper nitride layer 28 is formed in the interface between the first copper wiring 12 and the diffusion preventing insulation film 26 in the structure of the second embodiment shown in FIG. 2. This embodiment exhibits technical effects and advantages similar to those exhibited by the second embodiment.

With the provision of the copper nitride layer 28 in the interface between the first copper wiring 12 and the diffusion preventing insulation film 26, the barrier property against diffusion of copper atoms into the insulation film can be enhanced, and further, it is possible to provide a reliable semiconductor device.

Further, since the barrier property against diffusion of copper atoms can be enhanced by the copper nitride layer 28, the diffusion preventing insulation film 26 can have a less film thickness, and accordingly, the second interlayer insulation film 15 having a dielectric constant lower than that of the diffusion preventing insulation film 26 can have a larger film thickness, thereby it is possible to reduce the interwiring capacitance.

It is noted that although explanation has been made of the seventh embodiment such that the copper nitride layer 28 is provided only in the interface between the first copper wiring 12 and the diffusion preventing insulation film 13, the copper nitride layer 28 may be formed in the interface between the first copper wiring 12 and the via 19.

However, it is preferable to provide the copper nitride layer 28 only in the interface between the first copper wiring 12 and the diffusion preventing insulation film 26 in view of the reduction of contact resistance between the via and the wiring.

Eighth Embodiment

Next, explanation will be made of an eighth embodiment of the present invention with reference to FIG. 8 which is a sectional view illustrating a principal part of a semiconductor device in the eighth embodiment. Like reference numerals are used to denote like parts to those explained in the second embodiment.

Figure 8:
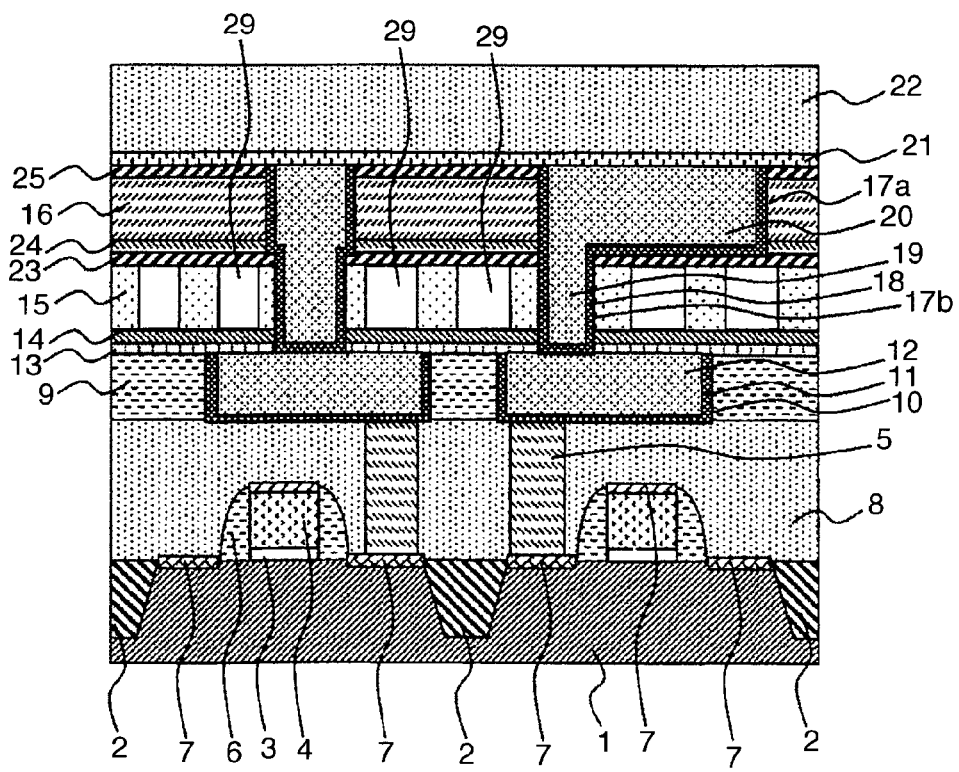
FIG. 8 is a sectional view illustrating a principal part of a semiconductor device in an eighth embodiment of the present invention.

The semiconductor device in this embodiment shown in FIG. 8 has the same configuration as that of the second embodiment, except that a space 29 is formed in at least a part of the second interlayer insulation film 18 in the structure of the second embodiment shown in FIG. 2. This embodiment exhibits technical effects and advantages similar to those exhibited by the second embodiment.

Further, with the provision of a space 29 in at least a part of the first interlay insulation film, there is exhibited such an advantage that the interwiring capacitance can be further decreased.

Ninth Embodiment

Next, explanation will be made of a ninth embodiment of the present invention with reference to FIG. 9 which is a sectional view illustrating a principal part of a semiconductor device in the ninth embodiment. Like reference numerals are used to denote like parts to those explained in the eighth embodiment.

Figure 9:
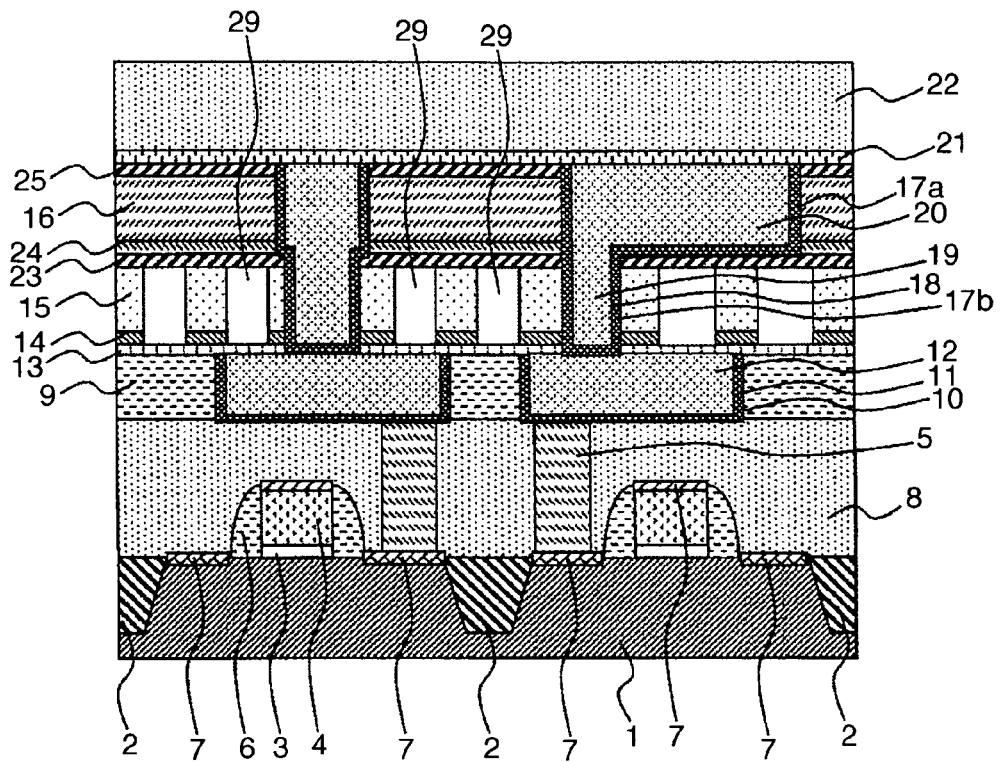
FIG. 9 is a sectional view illustrating a principal part of a semiconductor device in a nineth embodiment of the present invention.

The semiconductor device in this embodiment shown in FIG. 9 has the same configuration as that of the eighth embodiment shown in FIG. 8, except that not only the space 29 is formed not only in the second interlayer insulation film 15 but also in the first interlayer insulation film 14. This embodiment exhibits technical effects and advantages similar to those exhibited by the eighth embodiment.

With the provision of the space 29 also in the first interlayer insulation film 14, the interwiring capacitance can be further reduced in comparison with the eighth embodiment.

Thus, since the diffusion preventing insulation film 13 having a compression stress and the first interlayer insulation film 14 having a tensile strength are laminated one upon another on the first copper wiring 12 in a zone adjacent to the side wall of the via hole in which the via is formed, the stress gradient of the copper wiring can be effectively constrained. Thereby it is possible to prevent the resistance from being increased by voids.

Tenth Embodiment

Next, explanation will be made of a tenth embodiment of the present invention with reference to FIG. 10 which is a sectional view illustrating a principal part of a semiconductor device in the tenth embodiment. Like reference numerals are used to denote like parts to those explained in the eighth embodiment.

Figure 10:
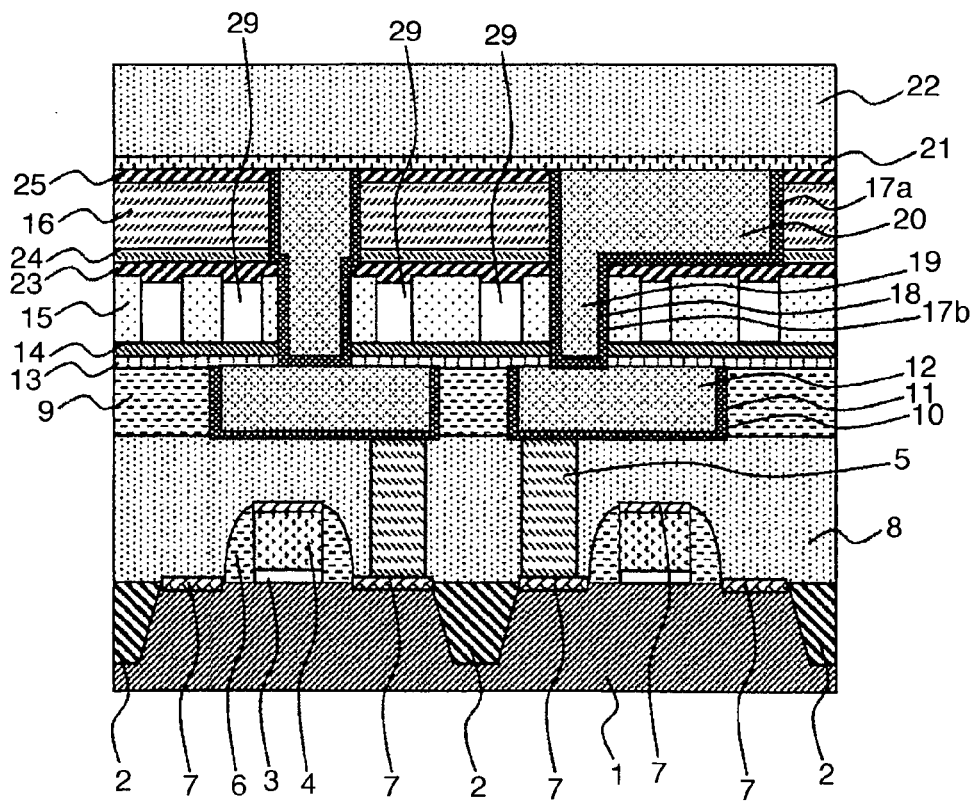
FIG. 10 is a sectional view illustrating a principal part of a semiconductor device in a tenth embodiment of the present invention.

The semiconductor device in this embodiment shown in FIG. 10 has the same configuration as that of the eighth embodiment, except that the insulation film 23 is wedged into the upper surface of the second interlayer insulation film 15 in the structure of the eighth embodiment shown in FIG. 8. This embodiment exhibits technical effects and advantages similar to those exhibited by the eighth embodiment.

Further, with the provision of such a configuration that the insulation film 23 is wedged into the upper surface of the second interlayer insulation film 15, the second interlayer insulation film 15 and the insulation film 23 can be prevented from peeling off in the interface therebetween, and accordingly, it is possible to provide a reliable semiconductor device.

Eleventh Embodiment

Next, explanation will be made of an eleventh embodiment of the present invention with reference to FIG. 11 which is a sectional view illustrating a principal part of a semiconductor device in the eleventh embodiment. Like reference numerals are used to denote like parts to those explained in the tenth embodiment.

Figure 11:
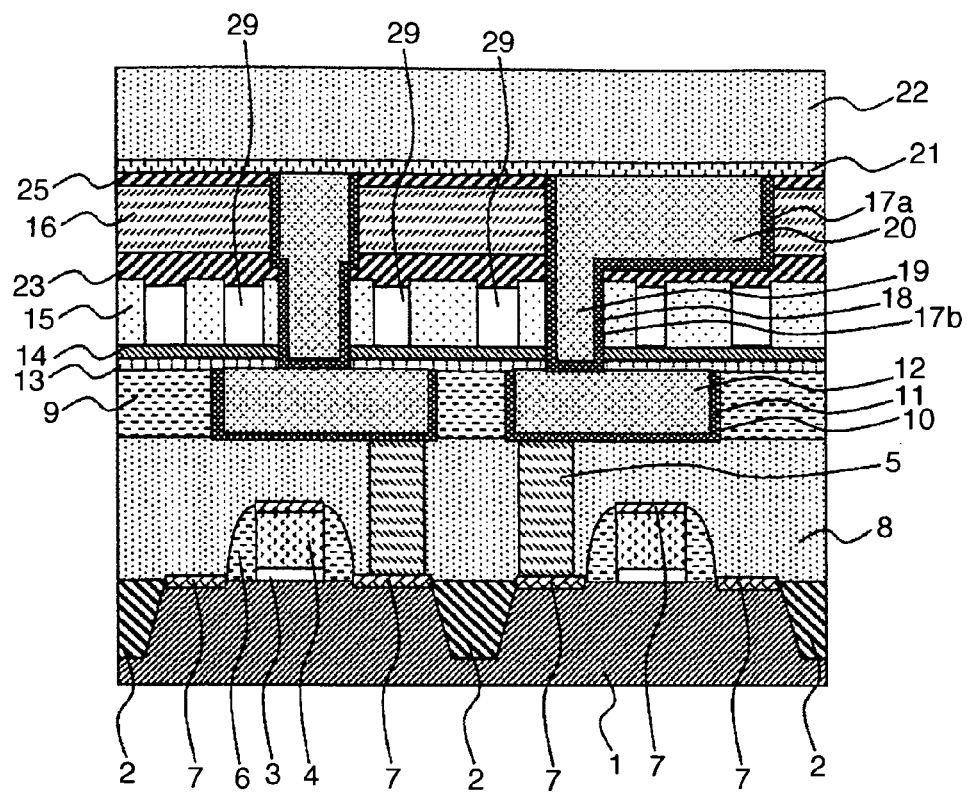
FIG. 11 is a sectional view illustrating a principal part of a semiconductor device in an eleventh embodiment of the present invention.

The semiconductor device in this embodiment shown in FIG. 11 has the same configuration as that of the tenth embodiment shown in FIG. 10, except that the insulation film 24 is not presented, and only the insulation film 23 serves as both diffusion preventing insulation film 15 of the low dielectric film and etching stopper film. This embodiment exhibits technical effects and advantages similar to those exhibited by the tenth embodiment.

Further, in this embodiment, with elimination of the necessity of the insulation film 24, it is also possible to exhibit such an advantage that man hours can be reduced.

Twelfth Embodiment

Next, explanation will be made of a twelfth embodiment of the present invention with reference to FIG. 12 which is a sectional view illustrating a principal part of a semiconductor device in the twelfth embodiment. Like reference numerals are used to denote like parts to those explained in the eleventh embodiment.

Figure 12:
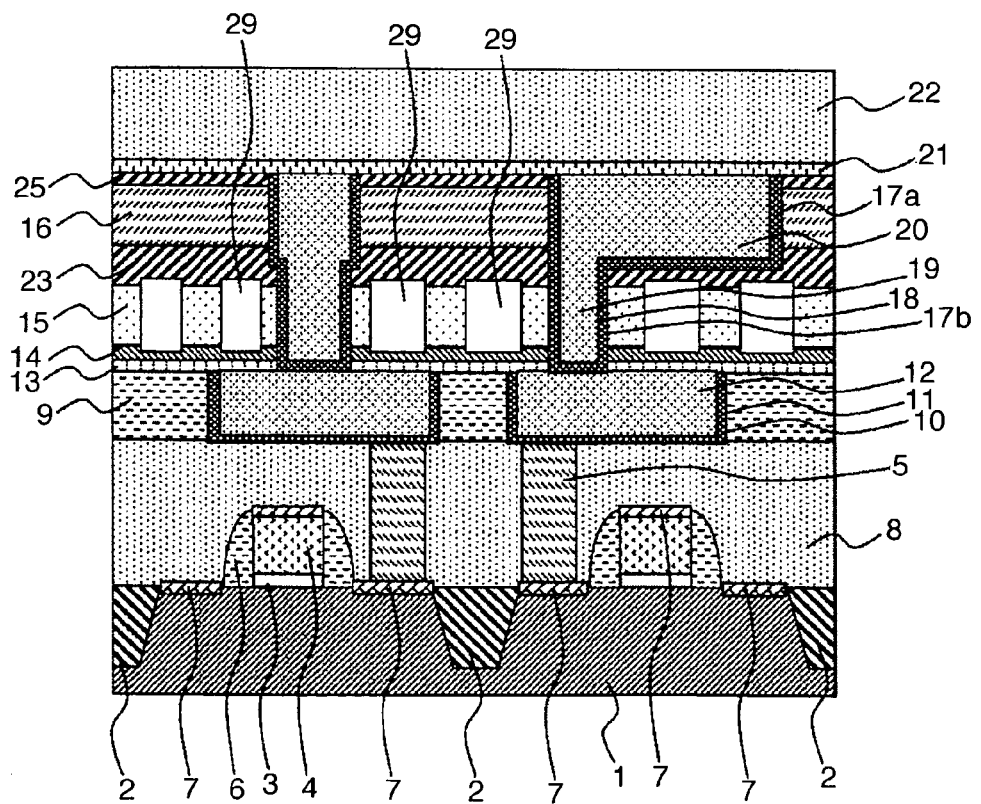
FIG. 12 is a sectional view illustrating a principal part of a semiconductor device in a twelfth embodiment of the present invention.

The semiconductor device in this embodiment shown in FIG. 12 has the same configuration as that of the eleventh embodiment shown in FIG. 11, except that a space 29 is wedged into the first interlayer insulation film 14. This embodiment exhibits technical effects and advantages similar to those exhibited by the eleventh embodiment.

Further, with the provision of such a configuration that the space 29 is wedged into the first interlayer insulation film 14, the first interlayer insulation film 14 and the second interlayer insulation film 15 can be prevented from peeling off in the interface therebetween, and further it is possible to provide a reliable semiconductor device.

Thirteenth Embodiment

Next, explanation will be made of a thirteenth embodiment of the present invention with reference to FIG. 13 which is a sectional view illustrating a principal part of a semiconductor device in the thirteenth embodiment. Like reference numerals are used to denote like parts to those explained in the eighth embodiment.

Figure 13:
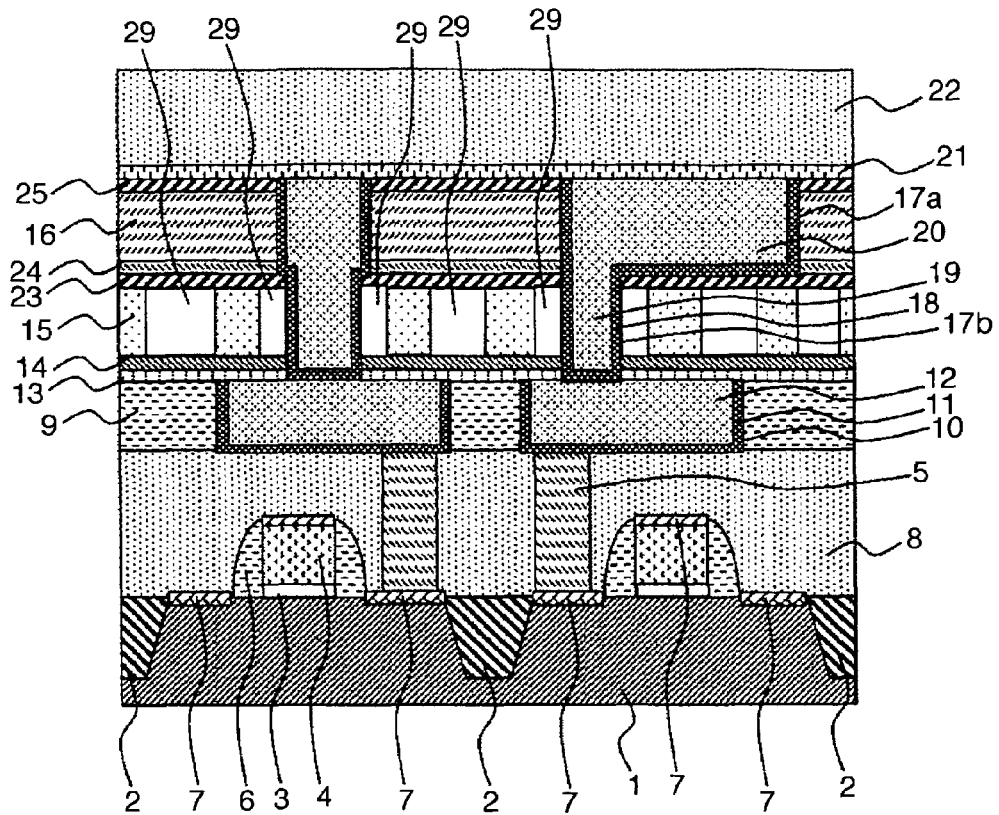
FIG. 13 is a sectional view illustrating a principal part of a semiconductor device in a thirteenth embodiment of the present invention.

The semiconductor device in this embodiment shown in FIG. 13 has the same configuration as that of the eighth embodiment shown in FIG. 8, except that a space 29 is adjacent to the via hole 17b. This embodiment exhibits technical effects and advantages similar to those exhibited by the eleventh embodiment.

Further, with the provision of such a configuration that the space 29 is adjacent to the via hole 17b, the interwiring capacitance can be reduced.

Thus, in the case of the space 29 provided adjacent to the via 19 in a zone adjacent to the side wall of the via hole 17b in which the via 19 is formed, with the provision of the structure in which the first interlayer insulation film 14 having a tensile stress is laminated in order to constrain the stress gradient of the copper wiring caused by the diffusion preventing insulation film 13 formed on the first copper wiring 12 and having a compression stress, it is possible to effectively constrain the stress gradient of the copper wiring, and accordingly, it is possible to prevent the resistance from being increased by voids.

Fourteenth Embodiment

Next, explanation will be made of a fourteenth embodiment of the present invention with reference to FIG. 14 which is a sectional view illustrating a principal part of a semiconductor device in fourteenth embodiment. Like reference numerals are used to denote like parts to those explained in the first embodiment.

Figure 14:
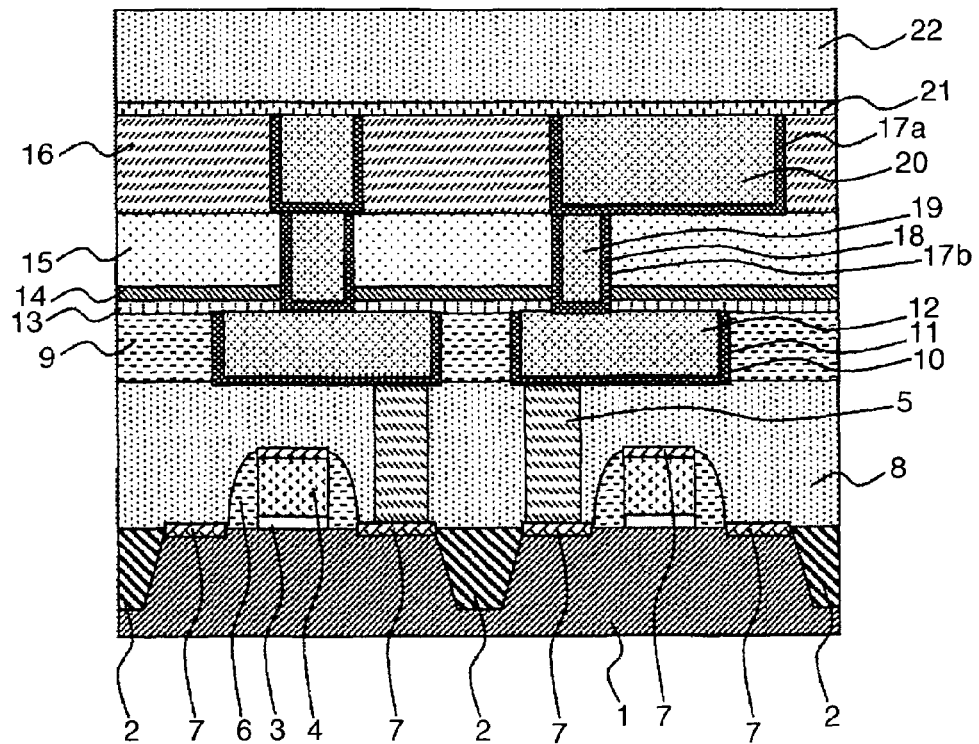
FIG. 14 is a sectional view illustrating a principal part of a semiconductor device in a fourteenth embodiment of the present invention.

The semiconductor device in this embodiment shown in FIG. 14 has the same configuration as that of the first embodiment shown in FIG. 1, except that a single damascene copper wring structure formed by a single damascene process is used instead of the dual damascene copper wiring structure with which the via 19 and the second copper wiring 20 are formed from one and the same copper film in the first embodiment, and further, the via 19 and the second copper wiring 20 are joined together through the intermediary of the barrier film 18. This embodiment exhibits technical effects and advantages similar to those exhibited by the eleventh embodiment.

It is noted that even in the other embodiments, although the dual damascene copper wiring structure has been explained, similar technical effects and advantages can be obtained even though the single damascene copper wiring structure is used.

It is noted that the present invention should not be limited to the semiconductor devices explained in the above-mentioned embodiment, and the number of the wiring layers should not be limited to two. Further, The semiconductor devices as stated above can be used in DRAM (dynamic random access memory), SRAM (static random access memory), a microcomputer or the like.

Although the present invention has been specifically described in detail in the form of the preferred embodiments, the present invention should not be limited to these embodiments, but various modification and change can be made thereto without departing the technical concept of the present invention.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A semiconductor device comprising:
    a first wiring formed on a semiconductor substrate through the intermediary of an insulation film and made of copper as a main component material,
    a first insulation film formed on the first wiring and having a barrier property against the copper of the first wiring, the first film having a compressive stress,
    a second insulation film formed on the first insulation film, and having a tensile stress,
    a third insulation film formed on the second insulation film, and having a tensile stress,
    a via formed on the first wiring and piercing through the third to the first insulation films, and
    a second wiring connected to the first wiring through the intermediary of the via,
    wherein the third insulation film has a dielectric constant which is lower than those of the first and second insulation films.

2. A semiconductor device as set forth in claim 1, wherein the first insulation film has a film thickness which is less than that of the second insulation film.

3. A semiconductor device as set forth in claim 1, wherein the first insulation film has a Yong's modulus which is larger than that of the second insulation film, but the first insulation film has a film thickness which is less than that of the second insulation film.

4. A semiconductor device as set forth in claim 1, wherein the second insulation film has a barrier property which is higher than that of a silicon oxide film, against copper of the first wiring.

5. A semiconductor device as set forth in claim 1, wherein the first insulation film is formed of an insulation film containing at least nitrogen atoms.

6. A semiconductor device as set forth in claim 1, wherein the third insulation film is a low dielectric insulation film.

7. A semiconductor device as set forth in claim 1, wherein an layer made of copper at least a part of which is nitrated is interposed between the first wiring and the first insulation film.

8. A semiconductor device as set forth in claim 7, wherein the layer made of copper at least a part of which is nitrated, has a film thickness which is less than that of the first insulation film.

9. A semiconductor device as set forth in claim 1, wherein a space is formed at least a part of the third insulation film.

10. A semiconductor device as set forth in claim 9, wherein the space is adjacent to a side wall of the via.

* * * * *